United States Patent [19]

Nakajima et al.

[11] Patent Number: 5,675,174
[45] Date of Patent: Oct. 7, 1997

[54] METHOD FOR USING FUSE STRUCTURE IN SEMICONDUCTOR DEVICE

[75] Inventors: Hirofumi Nakajima; Takanori Hitomi, both of Kyoto, Japan

[73] Assignee: Rohm Co., Ltd., Japan

[21] Appl. No.: 547,278

[22] Filed: Oct. 24, 1995

Related U.S. Application Data

[63] Continuation of Ser. No. 177,930, Jan. 6, 1994, abandoned.

[30] Foreign Application Priority Data

| Jan. 6, 1993 | [JP] | Japan | 5-000470 |
| May 13, 1993 | [JP] | Japan | 5-111764 |
| May 13, 1993 | [JP] | Japan | 5-111792 |

[51] Int. Cl.⁶ .................................................. H01L 29/00
[52] U.S. Cl. ........................... 257/529; 437/173; 437/922
[58] Field of Search .................................. 257/529, 209; 437/173, 922

[56] References Cited

U.S. PATENT DOCUMENTS

| 4,383,165 | 5/1983 | Smith et al. | 257/529 |
| 4,413,272 | 11/1983 | Mochizuki et al. | 257/529 |
| 4,590,388 | 5/1986 | Clemons et al. | 257/529 |
| 4,692,190 | 9/1987 | Komatsu | 257/529 |
| 4,740,485 | 4/1988 | Sharpe-Geisler | 257/529 |
| 4,748,491 | 5/1988 | Takagi | 257/529 |
| 4,764,800 | 8/1988 | Sander | 257/529 |
| 5,025,300 | 6/1991 | Billig et al. | 257/529 |
| 5,329,152 | 7/1994 | Janai et al. | 257/529 |
| 5,374,590 | 12/1994 | Batdorf et al. | 437/173 |

FOREIGN PATENT DOCUMENTS

| 58-60560 | 4/1983 | Japan . | |
| 2-33949 | 2/1990 | Japan | 257/529 |

*Primary Examiner*—J. Carroll
*Attorney, Agent, or Firm*—Merchant, Gould, Smith, Edell, Welter & Schmidt, P.A.

[57] ABSTRACT

This invention provides a semiconductor device wherein a fuse structure can be formed of a normal metal wiring material and the fuse structure can be cut easily and surely. A laser beam is applied three times to the fuse structure composed of an Al wiring 22 and a passivation film 24 to cut the fuse. The Al wiring 22 is sublimated to be almost cut as a consequence of a first laser beam application. However, a part of sublimated aluminum is cooled and solidified to possibly hinder the cutting of the fuse. In order to cope with the above phenomenon, second and third laser beam applications are effected on a point of coordinates P2 (P3) so that the area S2 (S3) is completely damaged.

15 Claims, 10 Drawing Sheets

METHOD FOR USING FUSE STRUCTURE IN SEMICONDUCTOR DEVICE

"This is a continuation of application Ser. No. 08/177,930, filed Jan. 6, 1994 abandoned".

BACKGROUND OF THE INVENTION

1. FIELD OF THE INVENTION

The present invention relates to a fuse structure in a semiconductor device, and more particularly to a simple and secure fuse structure and a method of cutting of the same.

2. DESCRIPTION OF THE PRIOR ART

Japanese Patent Laid-Open Publication No. SHO 58-60560 discloses a semiconductor memory in which, when a defective portion is found in testing the device, the portion can be disconnected by a fuse structure. In the semiconductor memory, a plurality of redundancy circuits are connected via the fuse structure with which the defective portion is disconnected by the fuse structure and removed. The fuse structure has a laminate film structure in which a polysilicon film is covered with a molybdenum film. The cutting of the fuse is effected in the following manner.

First, a laser beam, the energy being adjusted to an appropriate level, is applied to the fuse. With the above-mentioned operation, at the portion to which the laser beam is applied, the polysilicon film and the molybdenum film are heated to fuse and react with each other to form molybdenum silicide.

When the fuse surface is subsequently thermally oxidized, an oxidation film having a thickness greater than that of the molybdenum silicide is formed on the surface of the molybdenum. This is because the molybdenum silicide has an oxidation rate lower than that of the molybdenum.

Then by selectively etching the molybdenum silicide by an etching method having a low etching rate with respect to molybdenum oxide and silicon oxide (e.g., chemical dry etching), the fuse is cut.

By cutting the fuse, the defective portion is eliminated to compensate for the reduction of yield resulting in increasing integration density of semiconductor devices.

With this method, the fuse is cut not by means of a laser beam but by fusing, and therefore the output of the laser beam can be suppressed. With the above-mentioned arrangement, the possible thermal influence of the fuse on its peripheral devices is reduced.

However, the use of etching in the fuse structure described above results in the problem that the fuse cutting process is troublesome.

Furthermore, in the above-mentioned method, a polysilicon film having a superior characteristic of cutting by a laser beam is required to be wired in order to form the fuse structure. Therefore, in a semiconductor device where no polysilicon film is used as a structural body, it is required to purposely form a polysilicon film specially for the formation of the aforementioned fuse structure.

SUMMARY OF THE INVENTION

Accordingly, an object of the present invention is to solve the above-mentioned problem and provide a fuse structure of a semiconductor device capable of being surely cut without complicating the manufacturing process and the method for using.

A fuse structure in a semiconductor device comprises:
a substrate;
a metal wire which has a portion to be cut as formed above the substrate; and
a coating film to be coated on the metal wiring.

A method for cutting the fuse having a substrate, a metal wire which has a portion to be cut as formed above the substrate, and a coating film to be coated on the metal wiring, comprises steps of:
a first application step for applying a laser beam to a portion to be cut of the metal wiring, the application step resulting in a condition where a section surface and another section surface of the metal wiring are connected with each other by residual metal; and
a second application step for applying a laser beam to the portion at least one time to remove the residual metal produced in the first application step.

A fuse structure in a semiconductor device comprises:
a substrate;
a first metal wiring which has a portion to be cut as formed above the substrate and a first end and the other end;
a first insulating portion adjacent to the first end of the first metal wiring;
a second metal wiring insulated from the first metal wiring by the first insulating portion;
a first region formed in the substrate below the first insulating portion;
a first connecting portion for electrically connecting the first region with the first metal wiring;
a second connecting portion for electrically connecting the first region with the second metal wiring; and
a coating film for coating at least the first metal wiring.

A method for cutting a fuse structure comprises steps of:
a first application step for applying a laser beam to a portion to be cut of the metal wiring, the application step resulting in a condition where a section surface and another section surface of the metal wiring are connected with each other by residual metal; and
a second application step for applying a laser beam to the portion at least one time to remove the residual metal produced in the first application step,
said fuse structure comprising:
a substrate;
a first metal wiring which has a portion to be cut as formed above the substrate and a first end and the other end;
a first insulating portion adjacent to the first end of the first metal wiring;
a second metal wiring insulated from the first metal wiring by the first insulating portion;
a first region formed in the substrate below the first insulating portion;
a first connecting portion for electrically connecting the first region with the first metal wiring;
a second connecting portion for electrically connecting the first region with the second metal wiring; and
a coating film for coating at least the first metal wiring.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 7A and 7B are views showing a fuse structure in accordance with a second embodiment of the present invention, wherein FIG. 7B is a plan view of the fuse structure viewed from above a surface of a substrate, and FIG. 7A is a sectional view taken along the line VIIA—VIIA in FIG. 7B;

DESCRIPTION OF THE PREFERRED EMBODIMENT

Figure 1:
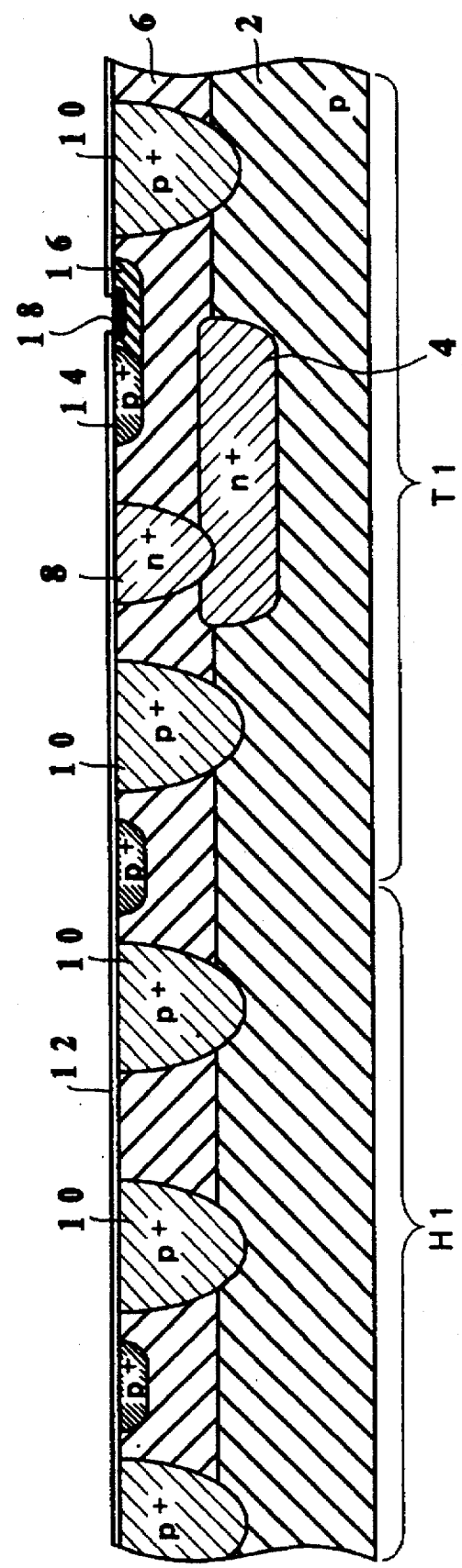
FIG. 1 is a view showing a method for manufacturing a fuse structure in accordance with an embodiment of the present invention.
Figure 2:
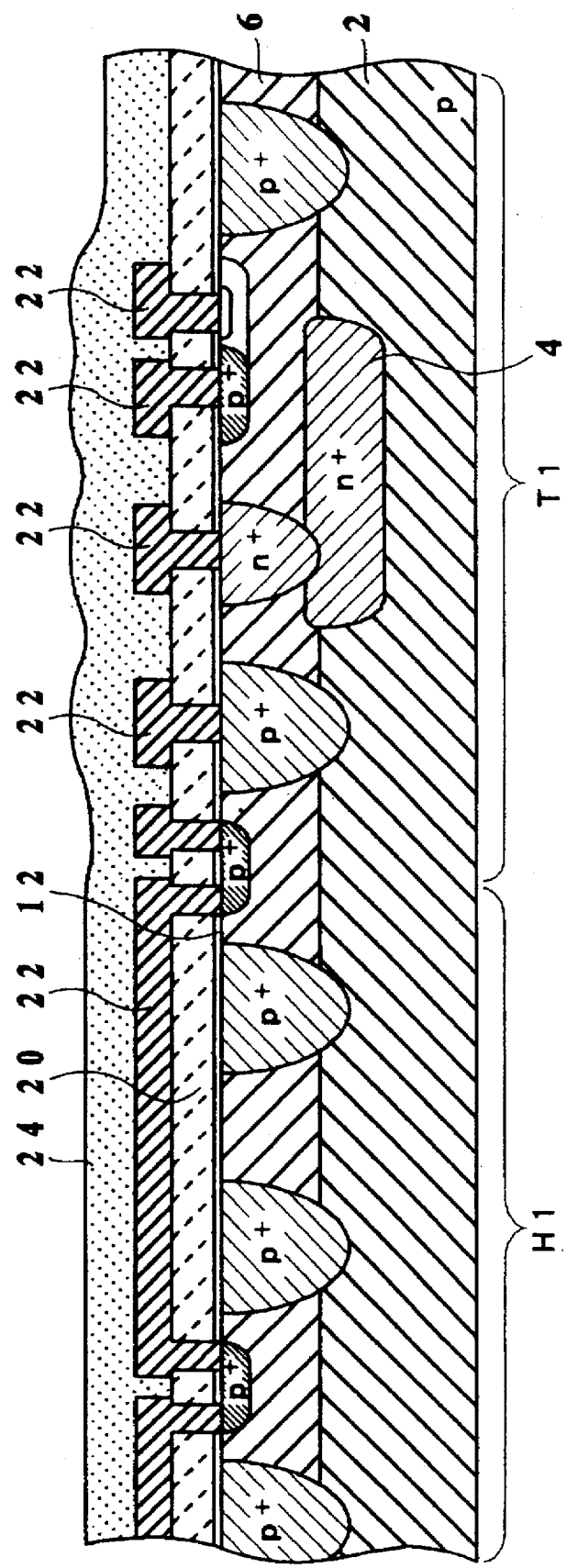
FIG. 2 is a view showing a fuse structure in accordance with an embodiment of the present invention.

The following describes a fuse structure for trimming in accordance with an embodiment of the present invention with reference to the attached drawings. FIGS. 1 and 2 are views showing a method for manufacturing a fuse structure in accordance with an embodiment of the present invention. The fuse structure is fabricated with a bipolar transistor in the process of manufacturing an LSI. In summary, a fuse structure is formed in a fuse structure formation region H1, and a bipolar transistor is formed in a transistor formation region T1.

First, in a manner as shown in FIG. 1, arsenic is diffused in a p-type silicon substrate 2 using an oxide film (not shown) as a mask to form an $n^+$-type diffusion layer 4. Further, an n-type silicon layer 6 is formed on an upper surface of the p-type silicon substrate 2 through epitaxial growth.

After forming a thermal oxidation film (not shown) on the wafer surface to form openings, n-type and p-type impurities are successively diffused to form an $n^+$-type diffusion region 8 and a $p^+$-type diffusion region 10. Note that the $p^+$-type diffusion region 10 is an isolation diffusion layer for electrically isolating each transistor on the LSI chip.

After removing the thermal oxidation film on the wafer surface by etching, the wafer surface is thermally oxidized again to form an oxidated insulating film 12. Then, boron ions are implanted into a region to be the base of the transistor. By diffusing the boron ions, a $p^+$-type outer base 14 and a $p^-$-type active base 16 are formed. Openings are formed at the oxidated insulating film 12 on the $p^-$-type active base 16 and the oxidated insulating film 12 on the $n^+$-type diffusion region 8, and phosphorus is diffused into the openings to thereby form an $n^+$-type emitter 18 in the $p^-$-type active base 16.

Subsequently, an Al wiring is formed between elements. First, in a manner as shown in FIG. 2, the entire wafer surface including the fuse structure formation region H1 is covered with an insulating film 20 by the CVD method. Then the insulating film 20 is selectively etched by means of a resist to provide contact holes for drawing out wires.

Al is then sputtered onto the entire surface of the structural body including the fuse structure formation region H1 to form a wiring pattern composed of a 0.5 μm-thick Al wiring 22. In order to protect the Al wiring 22, a silicon nitride film is deposited to a thickness of 1 μm by the CVD method to be a passivation film 24.

Through the above-mentioned steps, a bipolar transistor is formed in the transistor formation region T1. On the other hand, a fuse structure that has the Al wiring 22 as a metal wire and the passivation film 24 as a coating film is formed in the fuse structure formation region H1.

Figure 3:
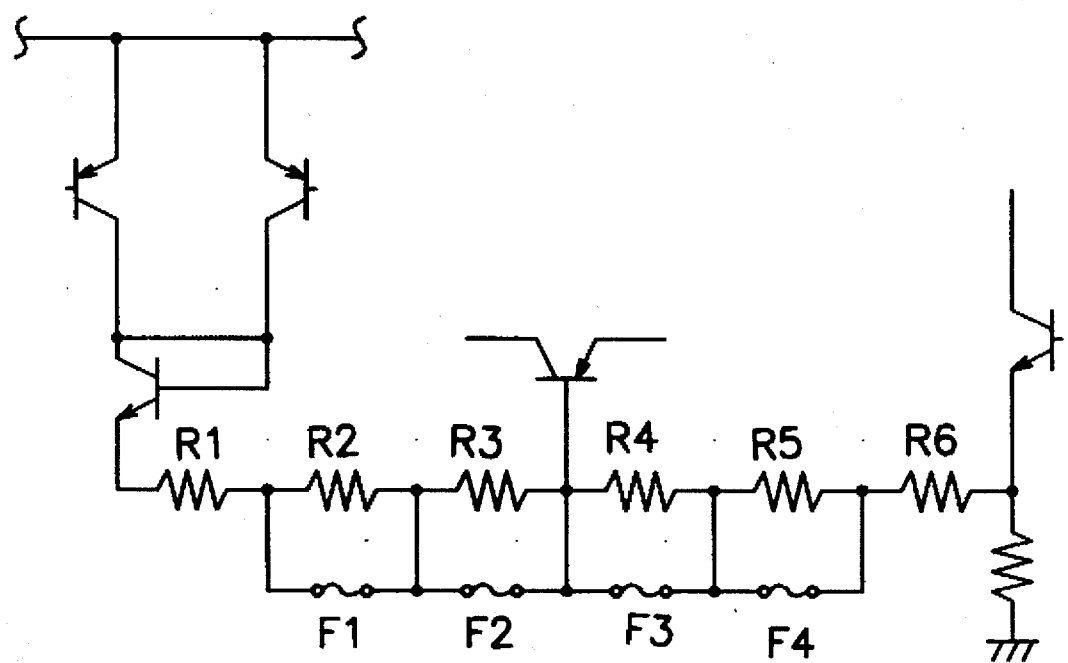
FIG. 3 is a view of an exemplified circuit employing the fuse structure.

Note that the functions and performance of the LSI are tested when the semiconductor device manufacturing process draws to a close. When the specifications of the objective electric characteristic items are out of the ranges of the intended specifications, the fuse structure is cut to tune the defective specifications of the electric characteristic items. For example, in a circuit as shown in FIG. 3, the tuning is achieved by cutting any fuse (F1 to F4) connected in parallel with resistors (R2 to R5) so that the fv distribution falls within the range of the intended specifications.

Figure 4A:
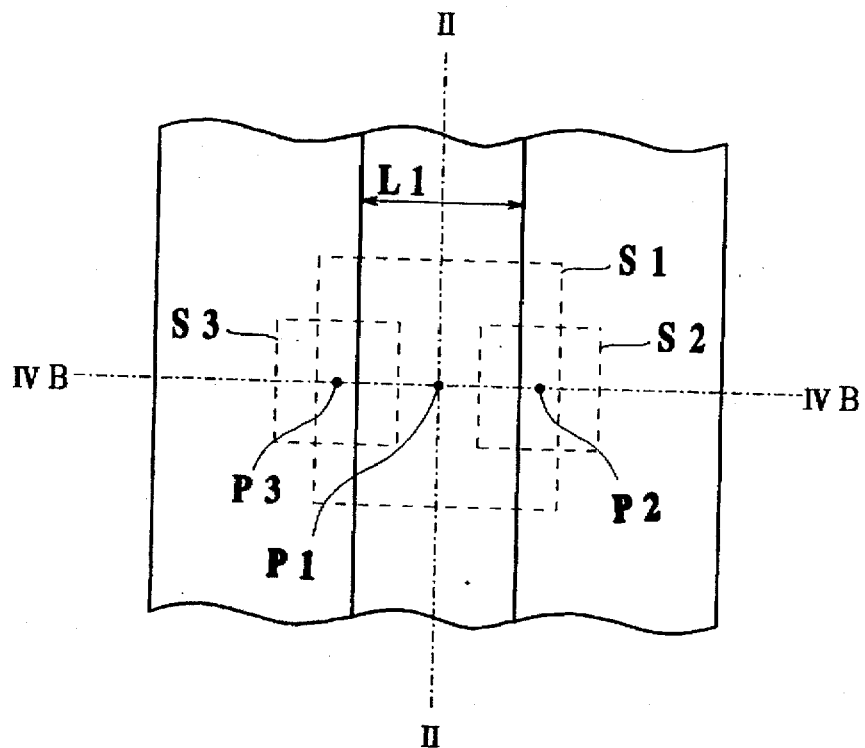
FIG. 4A is a plan view for explaining a laser beam application portion of the fuse structure.
Figure 4B:
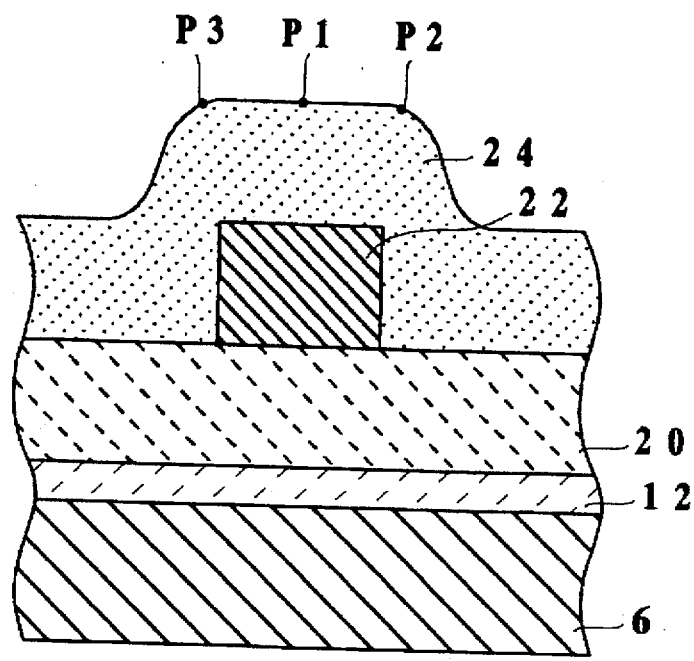
FIG. 4B is a sectional view taken along the line IVB—IVB in FIG. 4A.

The following describes a cutting method of the fuse structure based on FIGS. 4 through 6. FIG. 4A is a top view of a portion to which a laser beam is applied in the fuse structure. FIG. 4B is a sectional view of the fuse structure taken along the line IVB—IVB in FIG. 4A (referred to as the "widthwise direction of the fuse" hereinafter) (including the n-type silicon layer 6, oxidated insulating film 12, interlayer insulating film 20, Al wiring 22 and passivation film 24). Note that FIG. 2 is a sectional view of the fuse structure taken along the line II—II in FIG. 4A.

First, in order to cut the Al wiring 22 in the widthwise direction of the fuse, a first laser beam application, i.e., the first application step is effected. The point of coordinates to which a laser beam is applied is determined to be the center P1 in the widthwise direction of the fuse. The laser beam energy, beam size, and beam pulse are adjusted so that the Al wiring 22 is damaged throughout its entire width (width L1) at and around the center point P1 (area S1) and so that the damage does not reach the n-type silicon layer 6 and the oxidated insulating film 12.

Note that, in the present embodiment, LR2F manufactured by NIKON was used as a laser repairing apparatus and the operation condition was such that the laser was Nd YLF semiconductor laser, the wavelength was 1047 nm, the intensity of energy was 4 to 8 μJ, and the beam spot was a 6 to 10 μm square. The width of the employed fuse was not greater than 7 μm, and the thickness was 0.5 μm to 1.5 μm.

The passivation film 24 ensures cutting of fuse. The passivation film 24 is covering the Al wiring 22. Therefore, when the energy of the laser beam is given to the Al wiring 22 and Al is sublimated in the passivation film 24, the sublimated Al inflates in volume, with which the Al wiring 22 is burst and spattered together with the passivation film 24. With the above-mentioned operation, the fuse is almost cut in the laser beam application region as shown in FIG. 5B.

Figure 5A:
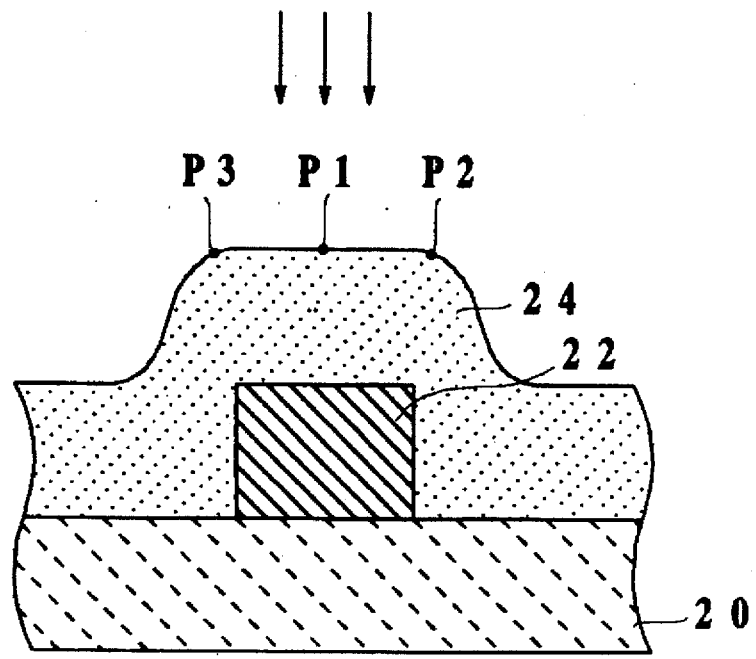
FIG. 5A is a view showing the state of the fuse structure before laser beam application.
Figure 5B:
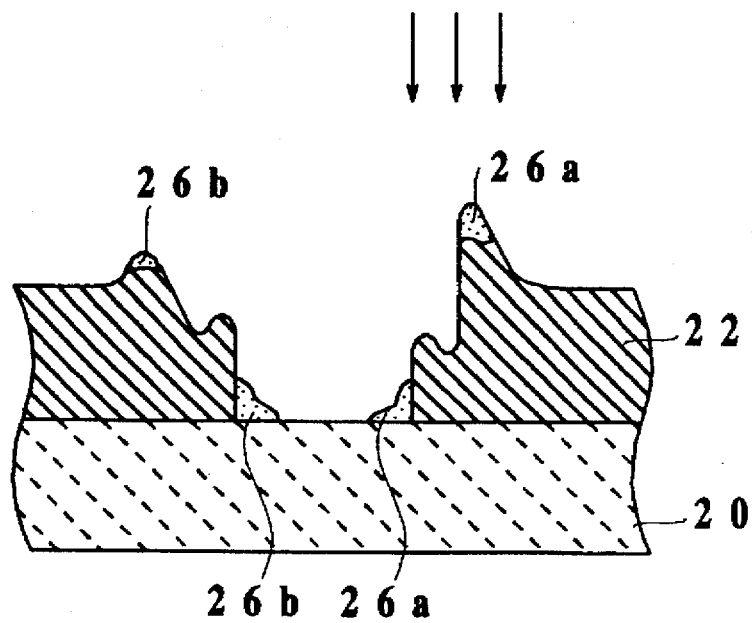
FIG. 5B is a view showing the state of the fuse structure after a first laser beam application.

In contrast to the above, when the passivation film 24 is not provided, by applying a laser beam from above the fuse structure as shown in FIG. 5A, the energy of the laser beam is given to the Al wiring 22, with which Al is sublimated momentarily. The sublimated Al is liquefied near the cut portion by being cooled to be subsequently solidified. With the above-mentioned actions, the fuse is not cut.

Although no sufficient theoretical corroboration is provided for the operation of the passivation film 24, the inventor considers it as described above.

Note that a part of aluminum burst spattered together with the passivation film 24 is possibly solidified near the cut portion creating an aluminum fragment 26 when it is cooled. When such an aluminum fragment 26 is existing, the fuse is possibly not completely cut depending on the adherence condition of the fragment. In anticipation of the above-mentioned condition, second and third laser beam applications are subsequently effected. In the present embodiment, the second and third laser beam applications correspond to the second application step.

The second laser beam application sets its target at a point of coordinates P2 located slightly outside of the Al wiring 22 on the passivation film 24. The laser beam energy, beam size, and beam pulse are adjusted so that only an edge portion of the Al wiring 22 will be damaged (area S2) at and around the point of coordinates P2. When a laser beam is applied from above as a second application in the condition as shown in FIG. 5B where the first application has been effected, a residual aluminum fragment 26a is sublimated to thereby obtain a section surface as shown in FIG. 6A.

In the third time, the laser beam application sets its target at a point of coordinates P3 on the side opposite from the target point in the second time. In the above time, the laser beam energy, beam size, and the beam pulse are adjusted so that an area S3 is damaged at and around the point of coordinates P3. In the present embodiment, the second and third laser beam applications are effected by adjusting the beam size at the same laser energy. By changing the beam size in a manner described as above, the quantity of heat per unit area can be increased. Therefore, when the width L1 of the Al wiring 22 is great, the portions which tend to be bridged can be concentratedly cut.

Figure 6A:
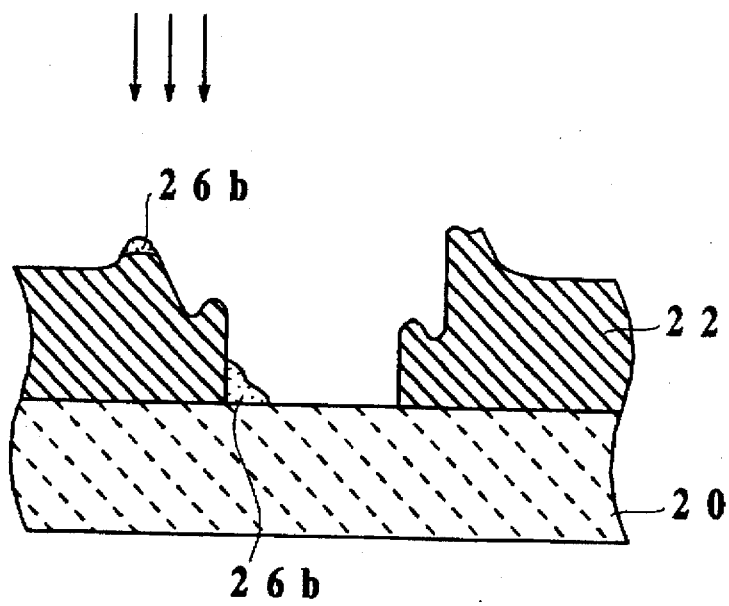
FIG. 6A is a view showing the state of the fuse structure after a second laser beam application.
Figure 6B:
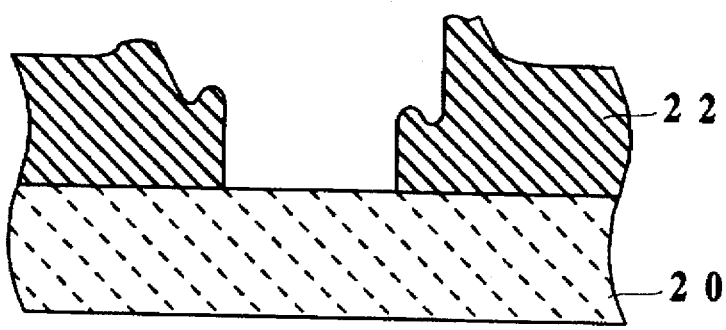
FIG. 6B is a view showing the state of the fuse structure after a third laser beam application.

When a laser beam is applied from above as a third application in the condition as shown in FIG. 6A where the second application has been effected, a residual aluminum fragment 26b is sublimated to thereby obtain a section surface as shown in FIG. 6B. By thus effecting the first through third laser beam applications, the fuse can be cut.

The fuse can be completely cut without damaging the n-type silicon layer 6 and the oxidated insulating film 12. Three times laser beam applications are effected by adjusting the laser beam energy, beam size, and beam pulse in the laser beam application process so that damage does not reach the n-type silicon layer 6 and the oxidated insulating film 12.

When the width L1 of the Al wiring 22 is narrow, the areas S2 and S3 may each have the same area as that of the area S1. The above is because, when the width L1 of the Al wiring 22 is narrow, the fuse can be completely cut even when the quantity of heat per unit area is small. There may be adjusted not only the beam size but also either one or both of the beam pulse and the laser energy according to the thickness of the Al wiring, coating film, or the like to be cut.

Although a bipolar transistor is formed as a semiconductor device connected to the fuse structure in the present embodiment, another semiconductor device may be formed instead. The present invention may be utilized in tuning in conformity to the intended electric standards by connecting a circuit element such as a capacitor or a resistor with the fuse structure.

Although the aluminum wiring film is used as the metal wiring film in the present embodiment, tungsten may be used instead, or an aluminum alloy such as AlSi, AlSiCu, or AlCu may be used as the wiring film.

Although the silicon nitride film is used as the coating film to be coated on the metal wiring film in the present embodiment, a silicon oxide film or the like may be used instead.

Note that the film thicknesses of the metal wiring film and the coating film as well as the areas S1 through S3 to be damaged by a laser beam are not limited to those described in the above-mentioned embodiment.

Although three times laser beam applications are effected, two or not less than four times laser beam applications may be effected.

Although the Al wiring 22 is cut throughout the entire width thereof (width L1) in the first laser beam application process in the present embodiment, a part of the entire width of the Al wiring 22 may be cut off in the first time and the remaining portion may be removed in any of the second and subsequent laser beam application processes.

According to the fuse structure and the circuit cutting method of the present invention, the metal wiring film is coated with a coating film. Therefore, the metal wiring film is effectively sublimated in comparison with the case where no coating film is providing when a laser beam is applied to the fuse structure in the first application step, with which the fuse is almost cut throughout the entire width thereof.

When a part of the sublimated metal wiring film is cooled and solidified again near the edge portions of the metal wiring film, the fuse can be completely cut because the remaining metal wiring film is removed in the second laser beam application step. Therefore, the defective portion of the semiconductor device can be disconnected easily and surely at the portion of the fuse structure to allow the yield to be increased.

Furthermore, circuit elements such as a capacitor or a resistor can be made to conform to the intended specifications easily and surely by the fuse trimming.

Furthermore, according to the fuse structure of the present invention, the metal wiring film is formed of aluminum, aluminum alloy, or tungsten. Therefore, the fuse structure can be formed of the metal material employed in a semiconductor device such as a semiconductor memory or in the process of manufacturing a circuit element such as a capacitor or a resistor. Therefore, it is not required to prepare another material exclusively for the formation of the fuse structure, meaning that a metal wiring film can be easily formed.

Since the coating film is composed of a silicon oxide film or a silicon nitride film in the fuse structure of the present invention, the coating film can be formed of a passivation film or a silicon oxide film employed in the process of manufacturing a semiconductor device such as a semiconductor memory. The above-mentioned arrangement allows the coating film to be easily formed.

Figure 7A:
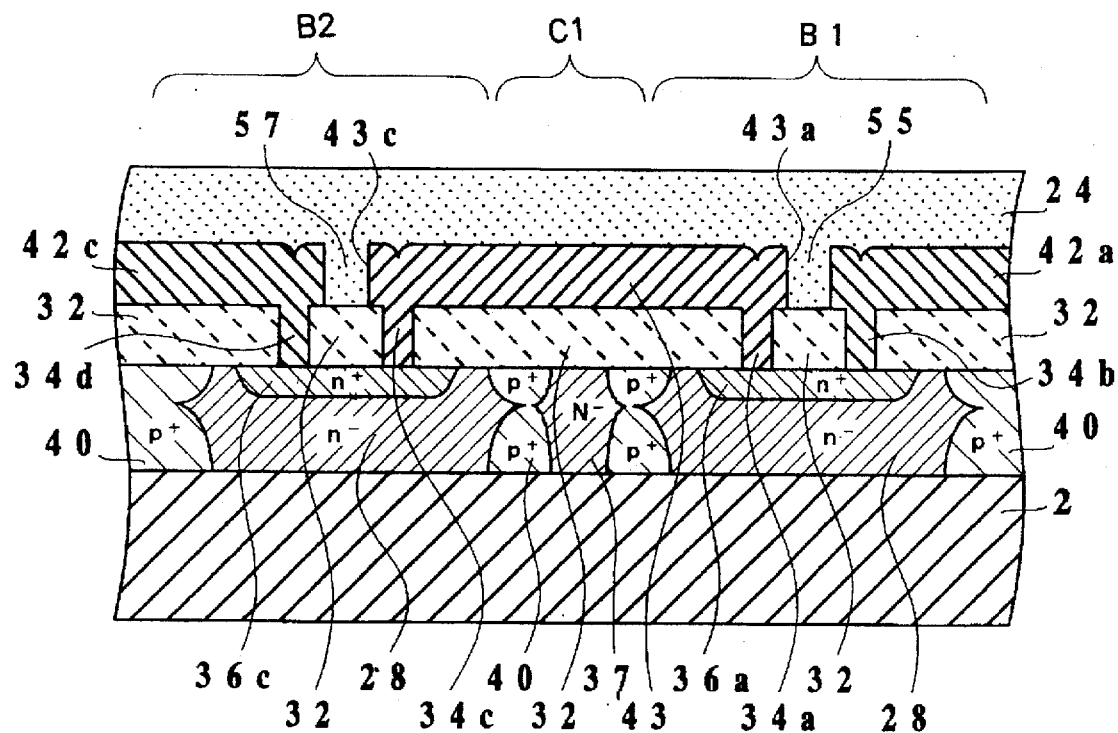
Figure 7B:
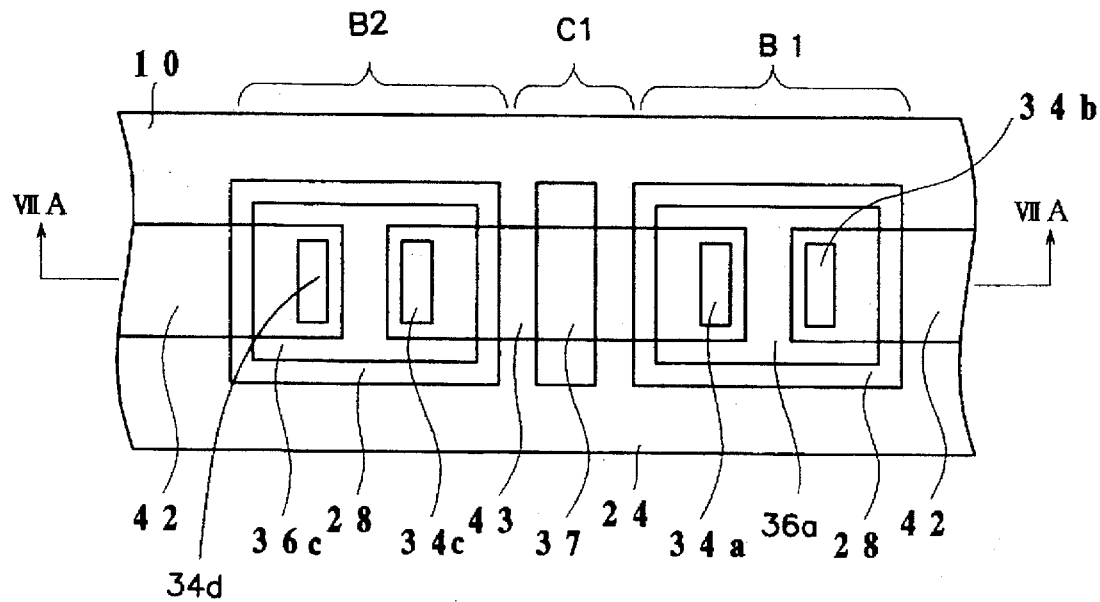

FIGS. 7A and 7B show a fuse structure for trimming in accordance with a second embodiment of the present invention. The fuse structure has a region C1 and regions B1 and B2 provided on opposite sides of the region C1. FIG. 7A is a sectional view taken along the line VIIB—VIIB in FIG. 7B.

The region C1 is a region for cutting an Al wiring by applying a laser beam to the film. As a substructure of the region C1, there is provided a n⁻-type epitaxial growth layer 37 as surrounded by a p⁺-type diffusion layer 40. In the region C1, there are further provided in order a cutting-use wiring 43 as a first metal wire and a passivation film 24 as a coating film. The passivation film 24 is formed of a silicon nitride film.

The regions B1 and B2 prevent the possible corrosion of aluminum from advancing toward the semiconductor device from the section surface of the cutting-use Al wiring 43 cut by laser beam application. When the section surface of the cutting-use Al wiring 43 is exposed to air, aluminum is oxidated to corrode. It is possible that the corrosion will not stop near the section surface to advance to the semiconductor device along the cutting-use Al wiring 43 as time elapses to damage the device. For the above reason, the region B1 stops the advancing of the corrosion of aluminum.

The following describes a substructure of the region B1. An n⁺-type diffusion layer 36a as a diffusion layer is provided in n⁻-type layer 28. At a first end 43a of the cutting-use Al wiring 43 is adjacently provided a first insulating portion 55. The first insulating portion 55 is also adjacent to a first connection-use Al wiring 42a as a connection-use metal wiring. The first connection-use Al wiring 42a and the cutting-use Al wiring 43 are insulated from each other by the first insulating portion 55. Note that the Al wiring 42a is connected to the semiconductor device.

The cutting-use Al wiring 43 and the n⁺-type diffusion layer 36a are connected with each other by way of a contact 34a as a first connecting portion. The connection-use Al wiring 42a and the n⁺-type diffusion layer 36a are connected with each other by way of a contact 34b as a second connecting portion.

The following describes a substructure of the region B2. An n⁺-type diffusion layer 36c as a diffusion layer is provided in the n⁻-type layer 28. At a second end 43c of the cutting-use Al wiring 43 is adjacently provided a second insulating portion 57. The second insulating portion 57 is also adjacent to a connection-use Al wiring 42c as a third metal wire. The connection-use Al wiring 42c and the cutting-use Al wiring 43 are insulated from each other by way of the second insulating portion 57. Note that the connection-use Al wiring 42c is connected to the semiconductor device.

The cutting-use Al wiring 43 and the n⁺-type diffusion layer 36c are connected to each other by way of a contact 34c as a third connecting portion. The connection-use Al wiring 42c and the n⁺-type diffusion layer 36c are connected with each other by way of a contact 34d as a fourth connecting portion.

The above-mentioned fuse structure is fabricated together with semiconductor devices (not shown) on both sides thereof, and the functions and performance of each semiconductor device are tested at the time the manufacturing process draws to a close. When the specifications of the objective electric characteristic items are out of the ranges of the intended specifications through a test, the cutting-use Al wiring 43 is cut to tune the specifications of the electric characteristic items. The method for cutting the fuse structure is the same as in the first embodiment, and therefore no description therefor is provided herein.

In applying the laser beam, a part of the passivation film 24 spatters away simultaneously with the sublimation of Al in a manner as described above. The cutting-use Al wiring 43 is exposed. Therefore, corrosion starts from the section surface of the film. The corrosion which has started from the section surface advances via the contact 34 to the n⁺-type diffusion region 36. However, no corrosion takes place inside the n⁺-type diffusion region 36 and the corrosion stops there.

Note that the n⁻-type epitaxial growth region 37 is formed as a substructure of the region C1 so that it is surrounded by the p⁺-type region 40 in the second embodiment (refer to FIGS. 7A and 7B). Therefore, even if the insulating film 32 is damaged and the cutting-use Al wiring 43 is short-circuited with the silicon substrate, the electric potential at the cutting-use Al wiring 43 can be stabilized.

The above is because the cutting-use Al wiring 43 is connected to a positive bias, and therefore the n⁻-type epitaxial growth region 37 becomes positive when the cutting-use Al wiring 43 is short-circuited with an n⁻-type epitaxial growth region 37. On the other hand, the p-type silicon substrate 2 and the p⁺-type region 40 are connected to a ground bias, and therefore the n⁻-type epitaxial growth region 37 and the p⁺-type region 40 form a p-n junction to be biased backward. Consequently, there is formed no current between the n⁻-type epitaxial growth region 37 and the p⁺-type region 40, for which the cutting Al wiring 43 receives no influence from the substrate potential.

Figure 8:
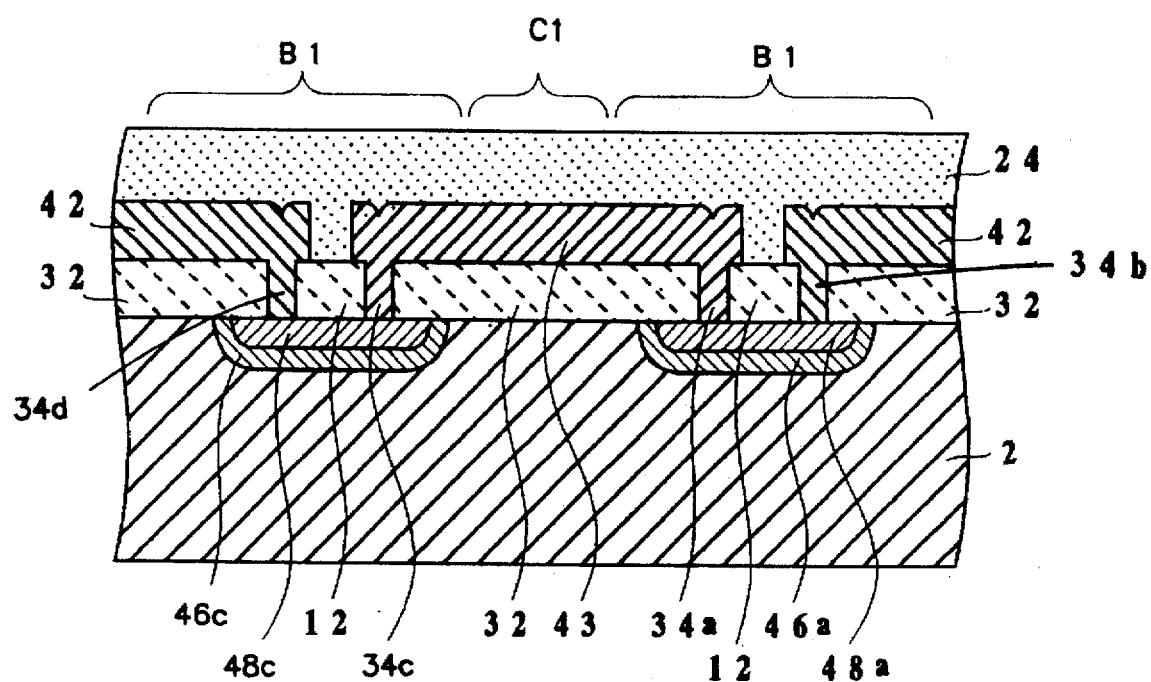
FIG. 8 is a sectional view of an essential portion of a fuse structure in accordance with a third embodiment of the present invention.

Although the n⁻-type layer 28 is provided on the p-type silicon substrate 2 and the n⁺-type diffusion region 36 is formed on the n⁻-type layer 28 in the aforementioned second embodiment, a region may be provided inside the p-type silicon substrate 2. FIG. 8 shows a third embodiment where an n⁻-type region 46a and 46c and an n-type region 48a and 48b are provided in the p-type silicon substrate 2. Note that the structure shown in FIG. 8 does not have the backward bias construction.

Figure 9:
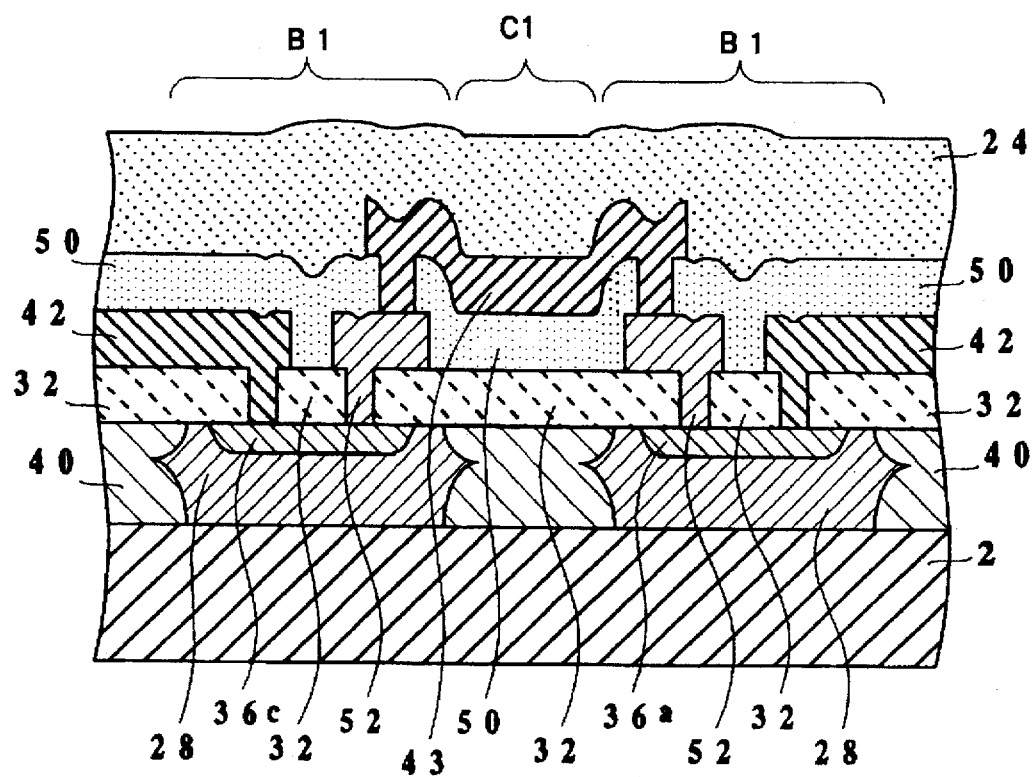
FIG. 9 is a sectional view of an essential portion of a fuse structure in accordance with a fourth embodiment of the present invention.

FIG. 9 shows a fourth embodiment. In the present embodiment, a two-layer Al wiring is provided. In a region C1 of the fuse structure, a cutting-use Al wiring 43 and a passivation film 24 are formed in order on an insulating film 32 via an interlayer insulating film 50. The cutting-use Al wiring 43 is connected to a contact-use Al wiring 52 at a lower layer portion. When the cutting-use Al wiring 43 in an upper layer portion is cut by a laser beam, the corrosion of aluminum advances from the section surface of the cutting-use Al wiring 43 toward the contact-use Al wiring 52, however, the corrosion stops at the n⁺-type diffusion region 36. With the above-mentioned arrangement, the corrosion of the metal wiring taking place in the region can be prevented from advancing toward a connection-use metal wiring as a wiring of a semiconductor element. Therefore, the yield in manufacturing the semiconductor device can be increased.

Instead of the above-mentioned arrangement, the region B1 may be composed of the npn structure (not shown).

Although the fuse structure is fabricated with the semiconductor device in the above-mentioned embodiment, the present invention may be utilized in tuning in conformity to the intended electric standards by connecting a circuit element such as a capacitor or a resistor with the fuse structure.

Although the connection-use Al wiring 42 is provided on both sides of the region C1, the connection-use Al wiring 42 may be provided on one side of the region C1 as connected with the semiconductor device or the like, and the other end of the region C1 may have another structure.

There is further provided a diffusion layer in the silicon substrate. The diffusion layer electrically connects the cutting-use metal wiring with the connection-use metal wiring, and after the metal wiring is cut by a laser beam, it prevents the corrosion of the metal wiring from advancing from the section surface. Therefore, the corrosion of the metal film can be prevented from advancing toward the connection-use metal wiring film as a wiring of a semiconductor element.

Furthermore, since aluminum or the like is used for the metal wiring and a passivation film or the like can be used for the coating film, the fuse structure can be formed of the material common to the circuit elements such as the semiconductor device, capacitor, and resistor. The above-mentioned arrangement allows a fuse structure to be easily formed.

According to the circuit cutting method of the present invention, a laser beam is applied to the cutting-use metal wiring coated with the coating film to sublimate the cutting-use metal wiring to thereby almost cut the fuse throughout its entire width or a greater part of its width in the first application step. A part of the sublimated cutting-use metal wiring is cooled to be solidified again near the edge portions in the widthwise direction of the cutting-use metal wiring. However, the solidified residual metal fragments of the cutting-use metal wiring are removed in the second application step, and therefore the fuse can be completely cut. In other words, the fuse can be completely cut only by the laser beam applications without etching nor other processing. Therefore, the fuse structure can be cut easily and securely.

Figure 10:
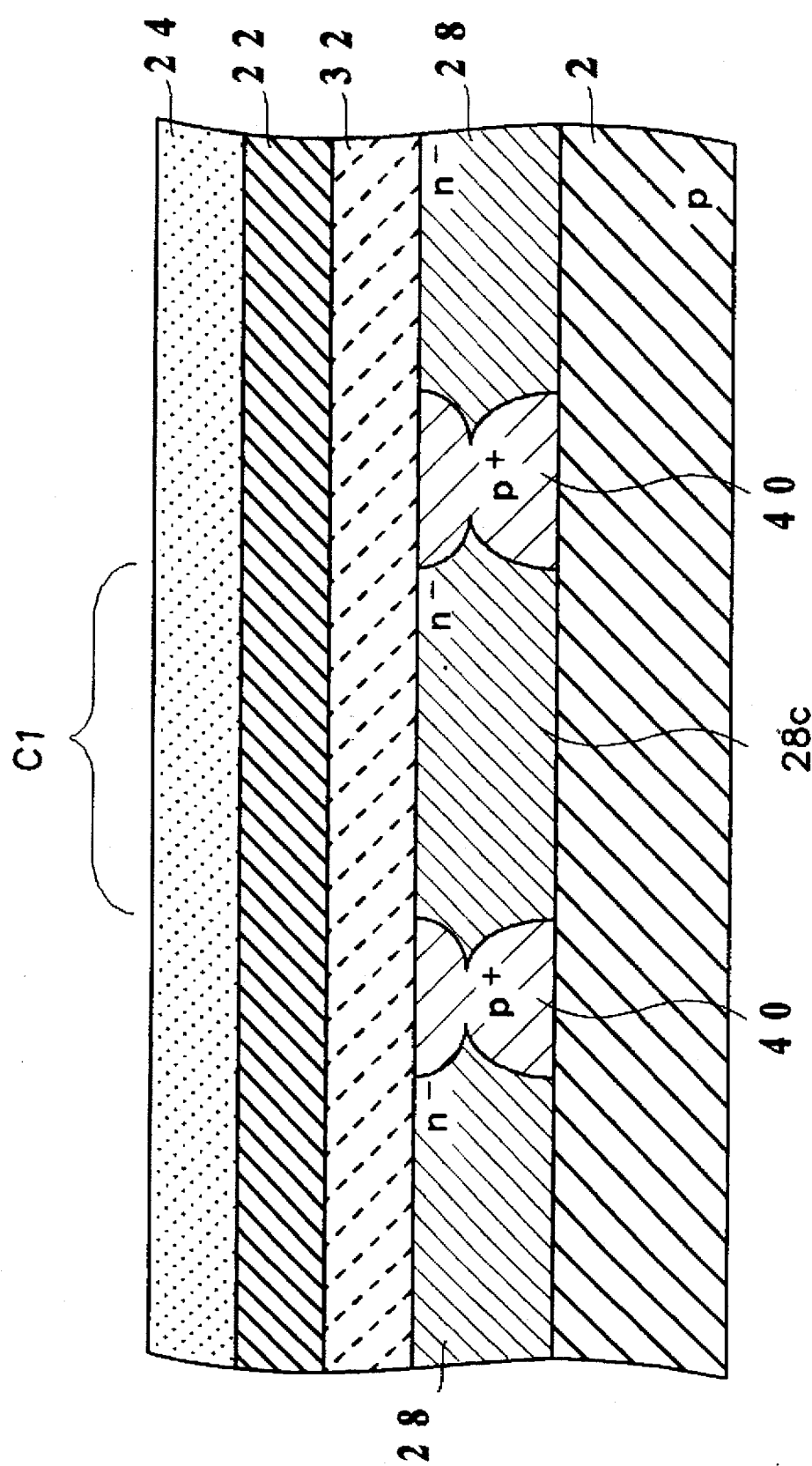
FIG. 10 is a sectional view of an essential portion of a fuse structure in accordance with a fifth embodiment of the present invention.

FIG. 10 shows a fuse structure for trimming in accordance with a fifth embodiment. In the present embodiment, an n$^-$-type epitaxial growth layer 28 is formed on a p-type silicon substrate 2 as shown in FIG. 10. On the n$^-$-type epitaxial growth layer 28 are formed in order an insulating film 32, an Al wiring 22 as a metal wiring, and a passivation film 24 as a coating film. A passivation film 12 is formed of a silicon nitride film. The laser beam application cuts the Al wiring 22 in a region C1.

A p-n junction which is formed by an n$^-$-type region 28 surrounded by a p$^+$-type diffusion layer 40, is provided, so that the electric potential at the Al wiring 22 is stabilized, even when the insulating film 32 is damaged to short-circuit the Al wiring 22 with the silicon substrate. The short-circuit between the Al wiring 22 and the silicon substrate 2 is caused by erroneously damaging the insulating film 32 by the laser beam. The electric potential at the short-circuited Al wiring 22 becomes unstable by receiving influence from the electric potential at the silicon substrate. Since the Al wiring 22 is connected to a positive bias, the n$^-$-type region 28 becomes positive when the cut Al wiring 22 is short-circuited with the n$^-$-type region 28. On the other hand, the p-type silicon substrate 2 and the p$^+$-type diffusion layer 40 are connected to a ground bias, and therefore the n$^-$-type region 28 and the p$^+$-type diffusion layer 40 form a p-n junction to be biased backward. Consequently, there is formed no current between the n$^-$-type region 28 and the p$^+$-type diffusion layer 40, for which the cut Al wiring 22 receives no influence from the substrate potential.

Figure 11A:
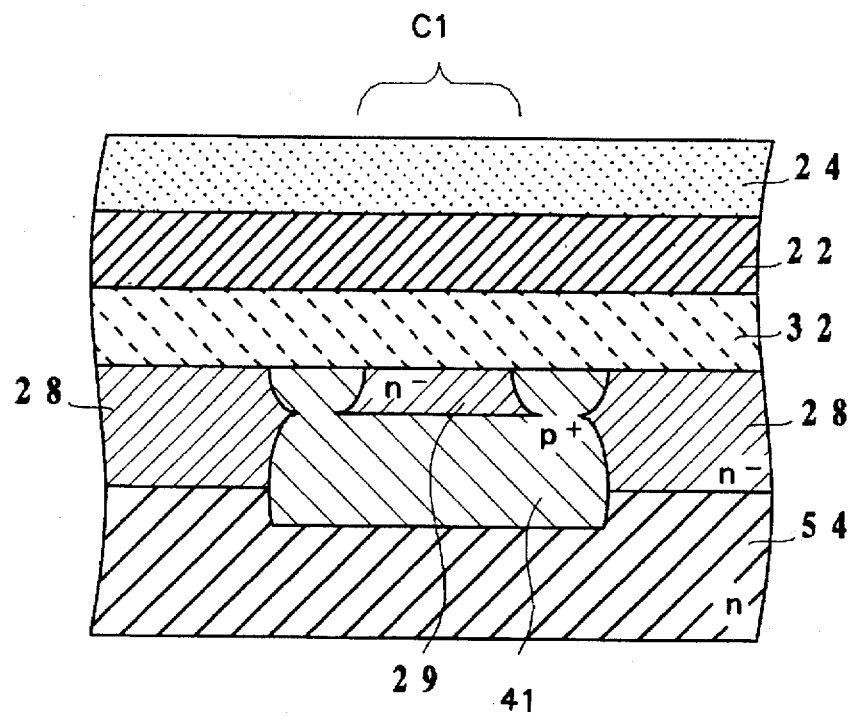
FIG. 11A is a sectional view of an essential portion of a fuse structure in accordance with a sixth embodiment of the present invention.

FIG. 11A shows a fuse structure in accordance with a sixth embodiment. An n$^-$-type epitaxial growth layer 28 is formed on an n-type silicon substrate 54. Below the region C1, an n$^-$-type region 29 is surrounded by a p$^+$-type region 41. On the epitaxial growth layer 28 are formed in order an insulating film 32, an Al wiring 22, and a passivation film 24. The Al wiring 22 is connected to a positive bias, while the p$^+$-type region 41 is connected to a negative bias. Since the n$^-$-type epitaxial growth layer 28 becomes positive when a cut Al wiring 22 is short-circuited with the n$^-$-type epitaxial growth layer 29 below the region C1, the layer forms with the p$^+$-type region 41 a p-n junction to be biased backward. Consequently, there is formed no current between the short-circuited n$^-$-type epitaxial growth layer 29 and the p$^+$-type region 41, for which the cut Al wiring 22 receives no influence from the substrate potential.

Figure 11B:
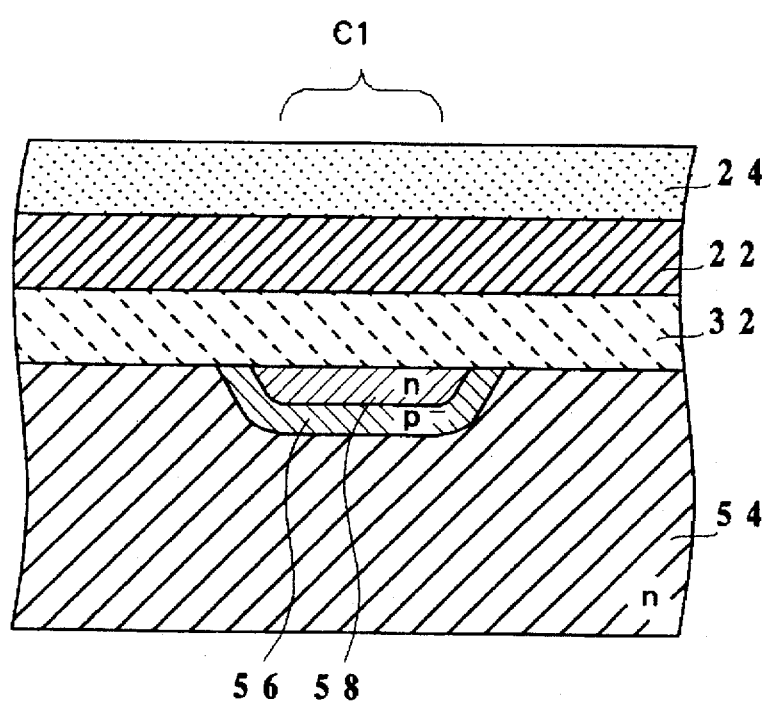
FIG. 11B is a sectional view of an essential portion of a fuse structure in accordance with a seventh embodiment of the present invention.

FIG. 11B shows a fuse structure in accordance with a seventh embodiment. In the present embodiment, no epitaxial growth layer is formed, and a p$^-$-type region 56 and an n-type region 58 are directly formed in an n-type silicon substrate 54. On the n-type silicon substrate 54 are formed in order an insulating film 32, an Al wiring 22, and a passivation film 24. The Al wiring 22 is connected to a positive bias, while the p$^-$-type region 56 is connected to a negative bias. When the cut Al wiring 22 is short-circuited with the n-type region 58, the n-type region 58 becomes positive to form with the p$^-$-type region 56 a p-n junction to be biased backward. Consequently, there is formed no current between the p$^-$-type region 56 and the region 58, for which the cut Al wiring 22 receives no influence from the substrate potential.

Although the fuse structure is fabricated together with the semiconductor device in the above embodiment, the present invention may be utilized in tuning in conformity to the intended electric standards by connecting a circuit element such as a capacitor or a resistor with the fuse structure.

On the other hand, an n-type diffusion layer is provided in the silicon substrate below the region. With the above-mentioned arrangement, the n-type diffusion layer short-circuited with the metal wiring forms with the p-type diffusion layer a p-n junction to be biased backward by applying a positive bias to the metal wiring and a ground bias to the p-type diffusion layer even when the damage advances to a portion below the metal wiring by a laser beam application. Consequently, there is formed no current through the p-n junction, for which the short-circuited metal wiring receives no influence from the substrate potential.

Furthermore, since aluminum or the like is used for the metal wiring and a passivation film can be used for the coating film, the fuse structure can be formed of the material common to the circuit elements such as the semiconductor device, capacitor, and resistor. The above-mentioned arrangement allows a fuse structure to be easily formed.

Although the present invention has been fully described by way of example with reference to the accompanying drawings, it is to be noted here that various changes and modifications will be apparent to those skilled in the art. Therefore, unless otherwise such changes and modifications depart from the scope of the present invention as defined by the appended claims, they should be construed as included therein.

What is claimed is:

1. A method for cutting a fuse element using energy from a laser beam, said fuse element being part of fuse structure in a semiconductor device having a substrate, a metal wire forming the fuse element and having a portion to be cut formed above the substrate, and a passivation film covering the metal wire, said metal wire having a center, the method comprising the steps of:

a first application step for applying the laser beam to the portion of the metal wire to be cut at the center of the metal wire, the portion to be cut of the metal wire on receiving the energy of the laser beam at the center of the metal wire sublimating and expanding under the covering of said passivation film until said portion to be cut of said metal wire together with a covering portion of said passivation film bursts to leave a cut portion and residual metal; and a second application step for applying the laser beam to the cut portion at a first side of the center to remove the residual metal located at the first side as produced in the first application step.

2. A fuse structure cutting method as claimed in claim 1, including a third application step for applying the laser beam to the cut portion at a second side of the center to remove the residual metal located at the second side as produced in the first application step, said center being between said first and second sides.

3. A method for cutting a fuse element using energy from a laser beam as claimed in claim 1, wherein
the substrate is a first conductive type, and the fuse structure further comprises:
a second conductive type region provided below the portion to be cut.

4. A method for cutting a fuse element using energy from a laser beam as claimed in claim 3, further comprising:
a first conductive type region surrounding the second conductive type region.

5. A method for cutting a fuse element using energy from a laser beam as claimed in claim 1, wherein
the first conductive type is the p-conductive type and the second conductive type is the n-conductive type.

6. A method for cutting a fuse element using energy from a laser beam as claimed in claim 1, wherein
the substrate is a p-type and the metal wire is a first metal wire and has a first end and the other end; and further comprising:
a first insulating portion adjacent to the first end of the first metal wire;
a second metal wire insulated from the first metal wire by the first insulating portion;
a first region formed in the substrate below the first insulating portion, the first region functioning to prevent corrosion of the second metal wire under the influence of the first metal wire;
a first connecting portion for electrically connecting the first region with the first metal wire;
a second connecting portion for electrically connecting the first region with the second metal wire; and
a passivation film covering the first metal wire.

7. A method for cutting a fuse element using energy from a laser beam as claimed in claim 6, wherein the substrate has an n-type region provided below the first region and a p-type region surrounding the n-type region.

8. A method for cutting a fuse as claimed in claim 5, wherein the passivation film is a silicon oxide film.

9. A method for cutting a fuse as claimed in claim 5, wherein the passivation film is a silicon nitride film.

10. A method for cutting a fuse as claimed in claim 5, wherein the metal wire is made of aluminum.

11. A method for cutting a fuse as claimed in claim 5, wherein the metal wiring is made of an aluminum alloy.

12. A method for cutting a fuse as claimed in claim 11, wherein the aluminum alloy is AlSi.

13. A method for cutting a fuse as claimed in claim 11, wherein the aluminum alloy is AlSiCu.

14. A method for cutting a fuse as claimed in claim 11, wherein the aluminum alloy is AlCu.

15. A method for cutting a fuse as claimed in claim 8, wherein the metal wire is made of tungsten.

* * * * *